United States Patent [19]

Linn et al.

[11] Patent Number: 6,143,376
[45] Date of Patent: Nov. 7, 2000

[54] METHOD FOR MANUFACTURING COATED SHORT FIBERS

[75] Inventors: Horst Linn, Eschenfelden; Kolja Rebstock, Ulm; Gerhard Emig, Erlangen; Helmut Gerhard, Nuremberg; Nadejda Popovska, Ulm; Volker Wunder, Ottensoos, all of Germany

[73] Assignees: DaimlerChrysler, Stuttgart; Friedrich-Alexander-Universitaet, Erlangen, both of Germany

[21] Appl. No.: 09/340,199

[22] Filed: Jun. 28, 1999

[30] Foreign Application Priority Data

Jun. 27, 1998 [DE] Germany .......................... 198 28 843

[51] Int. Cl.⁷ ................................ B05D 3/02; B05D 3/06
[52] U.S. Cl. .................. 427/557; 427/553; 427/249.3; 427/249.4; 427/249.15; 427/249.16; 427/249.19; 427/255.24
[58] Field of Search ..................... 427/551, 553, 427/557, 560, 255.24, 249.3, 249.15, 249.16, 249.19, 429.4

[56] References Cited

U.S. PATENT DOCUMENTS

| | | | |
|---|---|---|---|
| 4,315,968 | 2/1982 | Suplinskas et al. | 428/367 |
| 4,960,643 | 10/1990 | Lemelson | 428/368 |
| 5,472,650 | 12/1995 | Johnson et al. | 264/432 |
| 5,871,844 | 2/1999 | Theys et al. | 428/367 |

FOREIGN PATENT DOCUMENTS

| | | |
|---|---|---|
| 0102489 A2 | 3/1984 | European Pat. Off. . |
| 0 280 184 A2 | 8/1988 | European Pat. Off. . |
| 3706336 | 4/1988 | Germany . |
| 08231287 | 9/1996 | Japan . |
| WO 9426077 | 11/1994 | WIPO . |

OTHER PUBLICATIONS

Popovska N. et al., Chemical vapor deposition of titanium nitride on carbon fibres as a protective layer in metal matrix composites, Jun. 1997, vol. 18, (Abstract Only).

*Primary Examiner*—Katherine A. Bareford
*Attorney, Agent, or Firm*—Evenson, McKeown, Edwards & Lenahan, P.L.L.C.

[57] ABSTRACT

A method for manufacturing coated short fibers, in which the short fibers are coated in a reactor with at least one coating agent. The method includes exposing a short fiber bundle having a coating or a plastic matrix to a high-frequency field which dissolves the coating or the plastic matrix. The fiber bundle is separated into individual fibers and are coated by chemical vapor deposition on all sides by at least one coating agent present in a gas phase. A combination of mechanical and microwave treatment is preferably provided to loosen the short fiber bundles.

15 Claims, 7 Drawing Sheets

Stress-Strain Diagram of Ceramics With and Without Fiber Reinforcement 1. monolithic ceramic
2. composite ceramic with SiC-coated short carbon fibers
3. composite ceramic with uncoated short carbon fibers

Mechanical Properties of MMC Reinforced with Long Fibers

METHOD FOR MANUFACTURING COATED SHORT FIBERS

BACKGROUND AND SUMMARY OF THE INVENTION

This application claims the priority of German Patent Application No. 198 28 843.3, filed Jun. 27, 1998, the disclosure of which is expressly incorporated by reference herein.

The present invention relates to a method for manufacturing coated short fibers and to short fibers made by this method.

Short fibers are used in particular for manufacturing fiber-reinforced composites, for example fiber-reinforced ceramic matrix composites (CMC) and fiber-reinforced metal matrix composites (MMC). The fiber reinforcement causes increased ductility and hence increased tolerance of the composite matrix to damage. The fibers used for this purpose should in general be provided with a protective coating on all sides. This protective coating is deposited, of example, by chemical vapor deposition (CVD) or by dipping in a bath. The purpose of the coating is to prevent the fibers from reacting with the composite matrix (ceramic or metal). If possible, the fibers should be embedded in the composite unaltered and undamaged to achieve optimum ductility. Short fibers are particularly suitable for manufacturing fiber-reinforced composites since they become embedded in the composite in all three dimensions in disorderly fashion, resulting in a composite with isotropic material properties.

The technology of CVD coating and dip coating is also known. Thus far, however, only endless fibers have been coated, not short fibers. This is because the commercially available fibers are in the form of coated fiber bundles having a size to ensure that the fiber bundle holds together. Before CVD coating, the fiber bundle must be desized so that the fiber bundle comes apart and the fibers can be coated on all sides. This desizing is done by a thermal process in the case of endless fibers, in which the endless fibers are continuously fed from a feed roller, passed through an oven, then rolled up again onto a feed roller. In this way, the individual fibers resulting from desizing can be handled.

This is not possible with short fibers, however. Desizing causes the fiber bundle to disintegrate into disorderly individual fibers or filaments that cannot be readily handled. Thus, for manufacturing coated short fibers, endless fibers desized as described above are first coated then cut up into short fibers. Another alternative would be to coat the short fiber bundles directly (i.e., without desizing). The first alternative has the disadvantage that the cut surfaces are uncoated and therefore unprotected, so that they are able to react with the composite matrix and are exposed to oxidation. The second alternative would have the drawback that the sizing would interfere with the material properties of the resulting fiber-reinforced composite. Direct coating of desized short fibers has been repeatedly tested or proposed, but has not thus far been feasible.

Hence the goal of the present invention is to create a method of by which short fiber bundles can be desized and CVD-coated on all sides, whereby the short fiber bundles made by cutting up coated endless fibers can be coated on the cut surfaces.

According to the present invention, provision is also made for the short sized fiber bundles to be exposed to a high-frequency field in a reactor. When the short fiber bundle enters the high-frequency zone of the reactor, the coating is suddenly decomposed into gaseous products. The resulting gas phase also forces the individual fibers apart. Subsequently, the fibers thus separated are (1) exposed to at least one coating agent present in the gas phase, and (2) CVD-coated in the high-frequency field.

The method according to the present invention also makes it possible to coat the cut surfaces of short fibers made by cutting up coated endless fibers. These cut fibers are also CVD-coated in a high-frequency field with at least one of the coating agents present in the gas phase. This seals the cut surfaces so that they are unable to react with the composite matrix and are at the same time protected from oxidation.

The method according to the present invention thus makes it possible for the first time to coat short fibers on all sides directly. The method according to the present invention is not substrate-specific, so that fibers of all types can be coated.

The short fibers coated on all sides according to the present invention are protected against a reaction with the composite matrix and are thus chemically unchanged when they are embedded in the matrix. The coating acts as a diffusion and reaction barrier. The resulting composite is thus distinguished by improved mechanical properties, particularly increased ductility and accordingly enhanced strength and tolerance to damage. The coating also improves the wetability of the fiber surfaces by the matrix. This makes it possible to have a higher proportion of fiber components by volume in the composite, particularly with ceramic composites. Also, the individual fibers in the matrix are distributed more homogeneously than the coated fiber bundles previously used. When metal matrix composites are made by gas pressure melt infiltration, the infiltration pressure can be reduced to approximately one-tenth of the previous value because of the improved wetability.

Advantageously, carbon fibers, particularly short recyclate fibers, are used. Recyclate fibers, produced by shredding fiber-reinforced plastics, can be freed of the plastic matrix clinging to them by the method according to the present invention. A combination of high-frequency, ultrasound, and shock-wave treatment is particularly suitable for this purpose.

Another advantageous embodiment provides for the short fiber bundles coated with a size or a plastic matrix to first be mechanical loosened before they are placed in the high-frequency field. This facilitates the desizing that follows. Microwaves can advantageously be used as high-frequency waves.

The protective coating can be pyrocarbon, SiC, and/or Si coatings, but also TiN, TiC, and/or TiCN coatings. By the method according to the present invention, short carbon fibers can be coated with a pyrocarbon coating and with a carbon-graduated and/or Si-graduated silicon carbide coating or with a carbon-graduated and/or N-graduated titanium carbonitride coating. These graduated coatings are preferably deposited in a coating step by changing the deposition parameters.

For making silicon-containing coatings, methyltrichlorosilane/hydrogen, for example, may be used as the coating agent. For making titanium-containing coatings, titanium tetrachloride with nitrogen and possibly methane in hydrogen may be used as the coating agent.

The thickness of the coating can be controlled by varying the time the fibers spend in the reactor. This is advantageous, for example, when sealing the cut surfaces of short fibers made conventionally from coated endless fibers. In such cases, a thin coating suffices to seal off the cut surfaces.

Other objects, advantages and novel features of the present invention will become apparent from the following detailed description of the invention when considered in conjunction with the accompanying drawings.

DETAILED DESCRIPTION OF THE DRAWINGS

Figure 1:
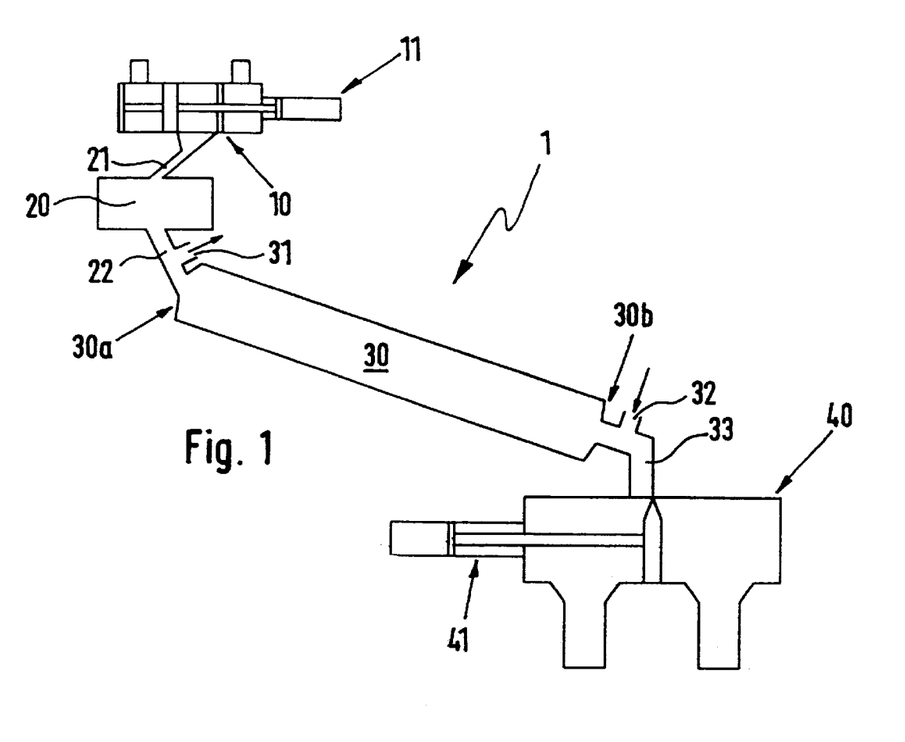
FIG. 1 is a schematic representation of a device for producing short fibers, coated on all sides, from short fiber bundles.

FIG. 1 shows schematically a device 1 for carrying out the method according to the present invention. Device 1 is used to coat short fibers on all sides from short fiber bundles. Device 1 has a supply container 10 for short fiber bundles, provided with a pneumatic input material changing device 11. Supply container 10 can be provided with a shaker that keeps the short fiber bundles in motion. Supply container 10 is connected to a device 20 for mechanically loosening the short fiber bundles. Device 20 can also have a shaker and is connected, via a feed chute 21 for feeding the fiber bundles, with supply container 10 and leads via a rotating feedthrough 22 for delivering the fiber bundles into the reactor 30 in the form of a rotary reactor tube in which the fiber bundles are coated on all sides by the method according to the present invention. Rotating feedthrough 22 has an opening 31 for removing the reaction gas from reactor 30. Reactor 30 can be replaced inside device 1, for example by a reactor with different dimensions. The bottom end 30b of a material outlet 33 also leads to reactor 30, said bottom end connecting reactor 30 to a collector 40 for the fibers coated on all sides. Material outlet 33 has an opening 32 for conducting the reaction gas into reactor 30. Collector 40 is also provided with a pneumatic input material changing device 41. Input material changing devices 11, 41 serve to provide the vacuum necessary for CVD coating in reactor 30 and to prevent foreign gas from entering reactor 30.

Figure 2:
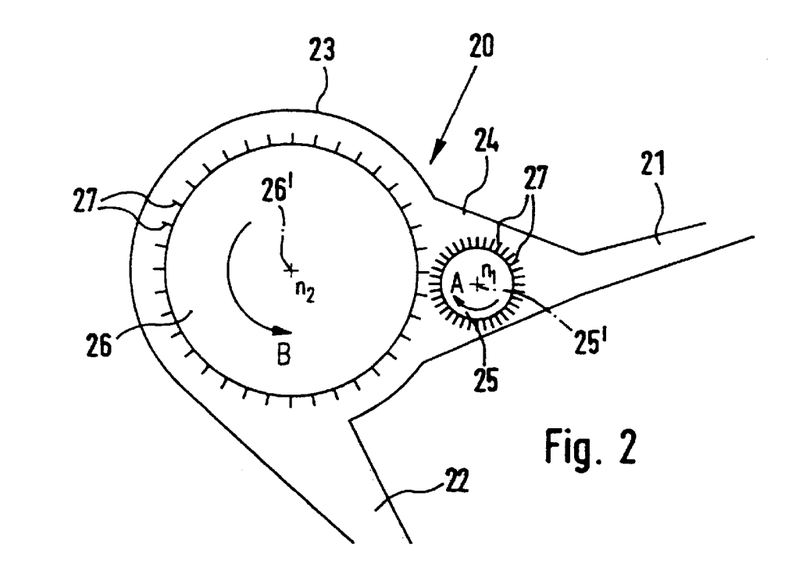
FIG. 2 is a schematic representation of a device for mechanically loosening short fiber bundles.

FIG. 2 shows schematically device 20 for mechanical loosening of the fiber bundle. Device 20 is modeled on the fiber crimping machines known in the textile industry. It consists essentially of a housing 23 with a funnel-shaped expansion 24 which receives chute 21 that feeds in the fiber bundles. Housing 23 contains a slowly moving feed needle roller 25 at the mouth of expansion 24, said roller rotating slowly clockwise about its lengthwise axis 25' as indicated in the embodiment by arrow A. The speed $n_1$ of roller 25 is approximately 5 to 10 rpm in the embodiment. A rapidly moving pickup needle roller 26 is located immediately next to feed needle roller 25. The pickup needle roller moves in the opposite direction to feed needle roller 25, in the counterclockwise direction indicated by arrow B in the embodiment, about its lengthwise axis 26'. The speed $n_2$ of roller 26 is significantly higher than speed $n_1$, amounting to approximately 5,000 to 10,000 rpm in the embodiment. Both rollers are provided with solid stainless steel needles 27. Their distance from each other, namely the distance between the two axes of rotation 25' and 26', is variable and can be set by the individual skilled in the art as required. The configuration of device 20, namely the width of rollers 25 and 26, their distance from each other, their rotational speeds, and the number of tightly spaced stainless steel needles 27 can be adapted by the individual skilled in the art to the quantity and type of the short fiber bundles to be processed. Rollers with tooth-shaped, strip-shaped, bump-shaped, projections or the like are possible instead of needle rollers.

Rotating feedthrough 22 ends at pickup needle roller 26 in housing 23 of device 20. Rotating feedthrough 22 is approximately at right angles to feed chute 21.

Figure 3:
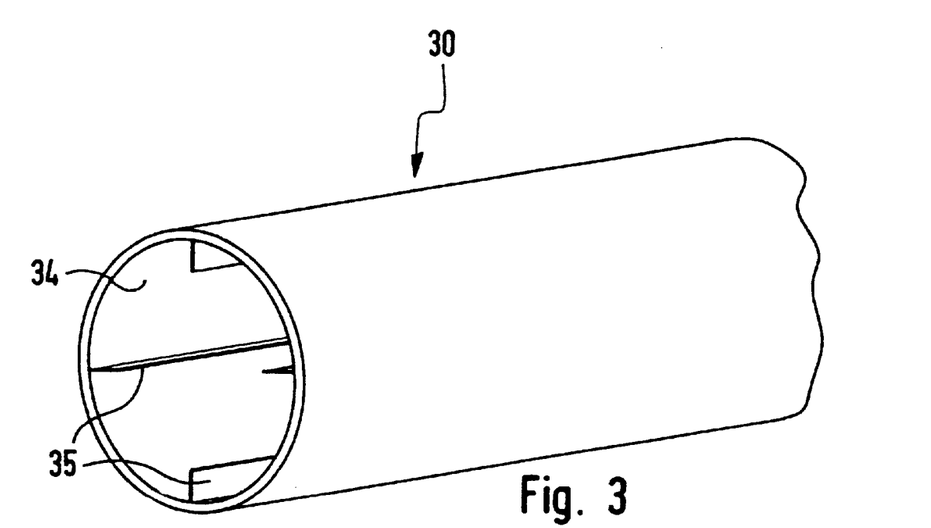
FIG. 3 is a schematic representation of a reactor tube.
Figure 4:
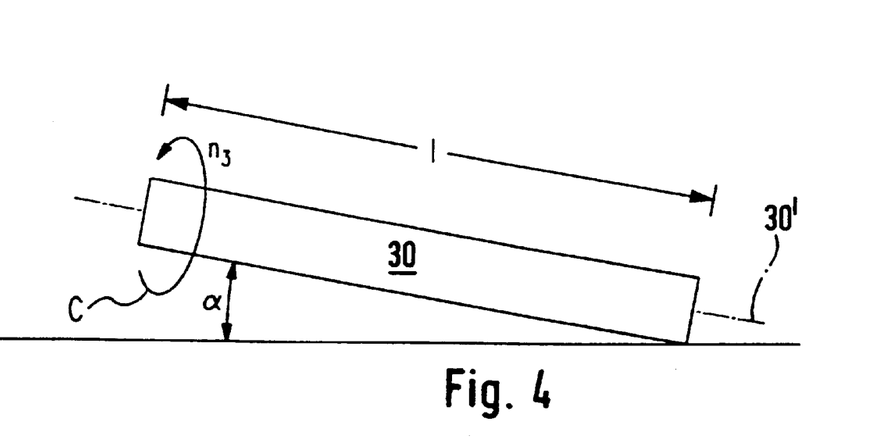
FIG. 4 is a schematic representation of the inclination of the reactor tube.

FIG. 3 shows reactor 30 schematically. Reactor 30 is actually a rotary reactor tube and is made of a microwave-safe material (e.g., $Al_2O_3$, quartz, or Teflon). One example of a suitable material is ALSINT, an oxide ceramic made of sintered corundum $Al_2O_3$. Fiber catchers 35 can have various shapes, e.g. ribs, bulges, indentations, and the like. Fiber catchers 35 can be free-standing, project into the tube of reactor 30, or rotate in the opposite direction to that of reactor 30. As shown in FIG. 4, reactor 30 is preferably inclined to the horizontal and has a length l. Reactor 30 rotates at speed $n_3$ in the direction of arrow C about its lengthwise axis 30'. The time spent in the reactor by the fiber bundles or fibers to be processed can be controlled by the individual skilled in the art by varying length l, the angle of inclination, and rotational speed $n_3$.

The reactor is heated by a high-frequency field, preferably a microwave field. One embodiment of this type, namely the combination of microwave heating with a homogeneous field following the principle of a microwave conveyor oven with a microwave-transparent processing tube, is described in German Patent DE 37 06 336 C1. Comparable heating is also described in WO 94/26077. Additionally, supplementary processing heat can be provided, for example, an induction heater and a susceptor and/or a microwave-type radiant heater.

In the embodiment, short fibers approximately 3 to 30 mm long are coated as follows. Commercially available short fiber bundles or recyclate fiber bundles are fed from supply container 10 through feed chute 21 of device 20. Due to the movement of rollers 25, 26 (rotational speeds: $n_1$: 6 rpm; $n_2$: 6000 rpm) and the action of needles 27, the fiber bundles are transported and mechanically loosened. At the end of pickup needle roller 26, the loosened fiber bundles drop, assisted by centrifugal force and reduced pressure, and possibly supported by an inert gas stream, into rotating feedthrough 22, and arrive at reactor 30.

Reactor 30 has an angle of inclination of 45° and a rotational speed $n_3$ of 5 to 10 rpm. A microwave field is created inside reactor 30. At the same time, reaction gas is introduced into reactor 30 through opening 32, and exits via opening 31. When the fiber bundles enter the microwave zone, the clinging coating (in commercially available fiber bundles) or the clinging matrix (in recyclate fiber bundles) breaks down suddenly into gaseous products, so that the individual fibers are separated from each other. The resulting gas phase forces the individual fibers further apart and exits the reactor. The individual fibers are then CVD-coated by the reaction gas. Reactor 30 is heated by the microwave heater with a homogenous field and/or by inductive heating.

The coated individual fibers arrive from reactor 30 through material outlet 33 at collector 40.

Separation of the fibers in the fiber bundles can also be accomplished by a combination of microwave, ultrasound, and/or shock-wave treatment. When the fibers remain in reactor 30 for a long time, for example if it has a long length l and/or a small angle of inclination, the use of shock waves is advantageous, keeping the fibers suspended in reactor 30.

The reaction conditions can vary depending on the type of fiber and the desired coating. With short carbon fibers, it is particularly advantageous to have coatings of titanium nitride (reaction gas: $TiCl_4/H_2/N_2$); pyrocarbon (reaction gas: $H_2/CH_4$); silicon carbide (reaction gas: $CH_3SiCl_3$ (MTS)/$H_2$); or graduated C/SiC/Si coatings (reaction gas: $CH_3SiCl_3$ (MTS)/$H_2$). When the coating is made of titanium nitride or silicon carbide, the following reactions take place:

The reaction conditions for various types of coatings are shown as examples in Table 1 below.

Figure 6A:
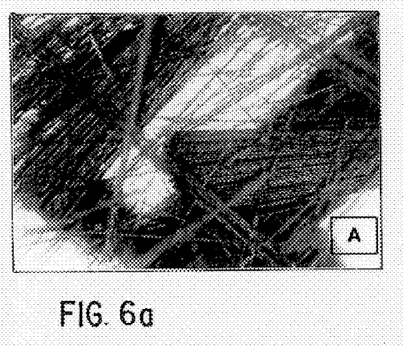
FIGS. 6a, 6b, and 6c are optical microscope images of commercial short carbon fibers: (a) untreated, (b) mechanically treated, and (c) treated with microwaves, respectively.
Figure 6B:
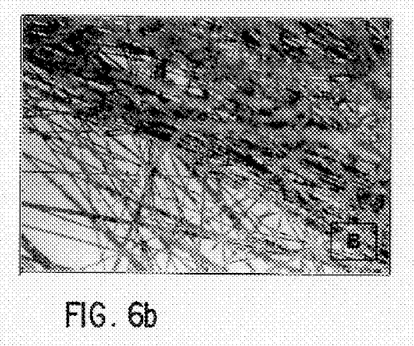
Figure 6C:
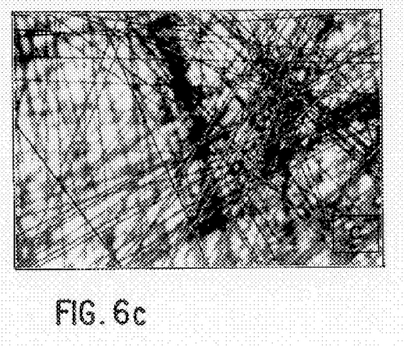
Figure 7A:
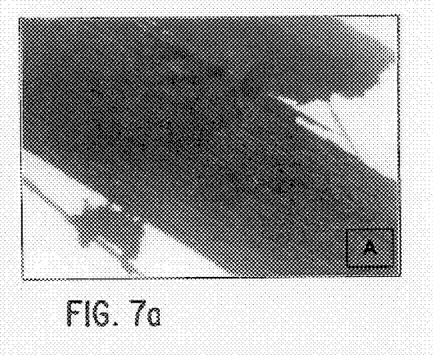
FIGS. 7a, 7b, and 7c are optical microscopes images of short recyclate carbon fibers: (a) untreated, (b) mechanically treated, and (c) treated with microwaves, respectively.
Figure 7B:
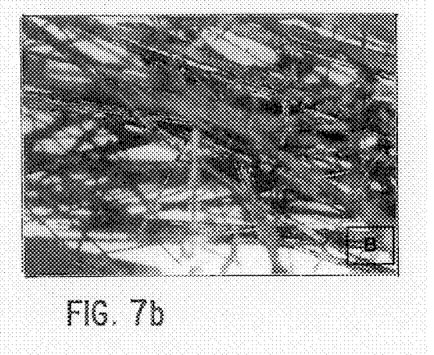
Figure 7C:
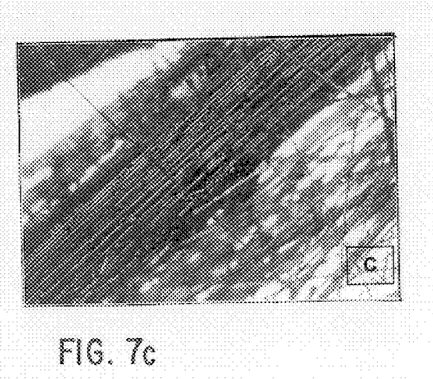

FIGS. 6*a* to 6*c* are optical microscope images of commercially available sized carbon fiber bundles in the untreated state (FIG. 6*a*), after mechanical loosening (FIG. 6*b*), and after separation of the fibers in the microwave field (FIG. 6*c*). FIGS. 7*a* to 7*c* are corresponding images of recyclate carbon fiber bundles. Loosening of the fiber bundles and separation of the fibers are clearly seen. Separation makes it possible for each individual fiber to be CVD-coated on all sides.

TABLE 1

| Coating | TiN | Pyrocarbon | C/SiC/Si | SiC |
|---|---|---|---|---|
| t (° C.) | 1150 | 1250 | 900–1200 | 1000 |
| $P_{(total)}$ (bars) | 1 | 0.1–1 | 1 | 1 |
| $H_2/N_2$ | 4 | — | — | — |
| $H_2/CH_4$ | — | 3 | — | — |
| $H_2/MTS$ | — | — | 8 | 4 |
| molar fract educt | 0.02 | 0.05 | 0.06 | 0.06 |
| $V_{(flow)}$ (cm/s) (NB) | 4 | 3 | 4 | 4 |

Figure 8A:
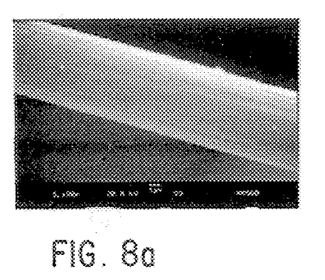
FIGS. 8a and 8b are REM images of short carbon fibers, coated with TiN (FIG. 8a) and SiC (FIG. 8b)
Figure 8B:
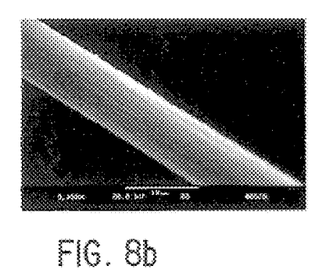

FIGS. 8*a* and 8*b* show coated fibers according to the present invention with a TiN coating (FIG. 8*a*) or an SiC coating (FIG. 8*b*). The coatings are about 15 to 30 nm thick. They are solid, continuous, and conform to the fiber surface.

By changing the deposition parameters, particularly the temperature and composition of the reaction gas mix, graduated coatings can be applied to the fibers in a single coating step. "Coatings" in this context are to be understood to be those which range in composition from pure carbon to silicon carbide to pure silicon, or from titanium carbide to titanium carbonitride to titanium nitride. The change in reaction temperature thus favors a continuous transition between the individual compositions, as temperature changes occur relatively slowly, on the order of minutes. The reaction mix can be changed a few seconds by changing the volume flows in the reaction gas feed inside different reactor sections. This also results in a continuous transition between the individual compositions.

In this way, the individual skilled in the art can adjust the interface in the fiber-reinforced composites to the matrix used by changing the chemical composition of the coatings deposited. On carbon fibers, carbon and/or silicon-graduated silicon carbide coatings can be deposited from MTS/$H_2$ or carbon- and or nitrogen-graduated titanium carbonitride coatings can be deposited from $TiCr_4/CH_4/N_2/H_2$, for example.

Tables 2 and 3 show the chemical compositions of graduated silicon carbide coatings (Table 2) and graduated titanium carbonitrade coatings (Table 3) as a function of the deposition conditions.

TABLE 2

| Temp ° C. | $H_2$/MTS ratio | Coating Composition |
|---|---|---|
| 900 | 2 | SiC |
| 900 | 4 | SiC + Si |
| 900 | 8 | Si |
| 1050 | 2 | SiC + C |
| 1050 | 4 | SiC |
| 1050 | 8 | SiC + Si |
| 1200 | 2 | C |
| 1200 | 4 | SiC + C |
| 1200 | 8 | SiC |

TABLE 3

| Temp ° C. | Reaction Gas Composition | Coating Composition |
|---|---|---|
| 1000 | $TiCl_4/CH_4/N_2/H_2$ | $TiC_{0.3}N_{0.7}$ |
| 1100 | $TiCl_4/CH_4/N_2/H_2$ | $TiC_{0.7}N_{0.3}$ |
| 1200 | $TiCl_4/N_2/H_2$ | TiN |
| 1050 | $TiCl_4/CH_4/N_2/H_2$ | TiCN |
| 1100 | $TiCl_4/CH_4/N_2/H_2$ | $TiC_{0.7}N_{0.3}$ |
| 1100 | $TiCl_4/CH_4/H_2$ | TiC |

Figure 5:
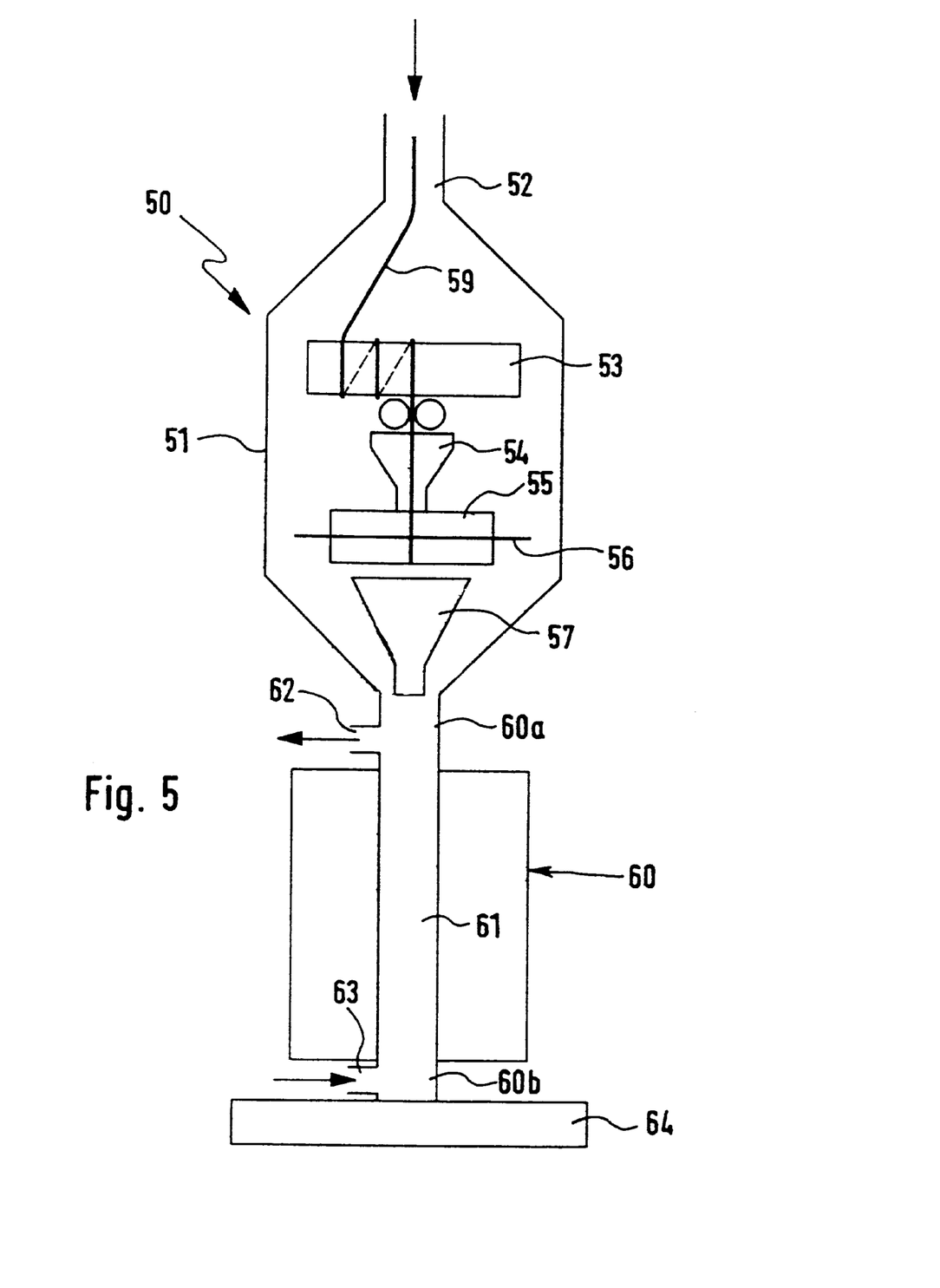
FIG. 5 is a schematic representation of a device for generating short fibers, coated on all sides, from long fibers.

FIG. 5 shows a device 50 for manufacturing short coated fibers coated on all sides, from endless fibers. Device 50 is connected to a known CVD coating system for endless fibers in which the fibers are continuously fed first through a resistance oven for desizing and then through an IR oven for CVD coating. The IR oven is connected via a mouth 52 with a housing 51 of device 50. A roller 53 is disposed in the vicinity of mouth 52 onto which the coated endless fibers are partially wound as indicated by line 59. Endless fibers 59 are then fed through a guide funnel 54 to a cutting device 55 provided with a cutter 56, in which device they are cut up into short fibers. The short fibers drop through a guide funnel 57 into an after-coating reactor 60 with a vertical reactor tube 61. After-coating reactor 60 at its upper end 60*a* facing cutter 55, has a reaction gas outlet 62 and at its lower end 60*b*, a reaction gas inlet 63. The time spent by the short fibers in the reactor is governed by the length of reactor tube 61. A collector 64 connects to the after-coating reactor.

In the embodiment, short fibers made from endless fibers and coated on all sides are made as follows. Endless carbon fibers (TENAX HTA 5331, 6000 filaments, from Akzo) are desized in a resistance oven at 900° C. in an inert gas stream and then coated in an IR oven with layers approximately 15 to 20 nm thick.

Table 4 below gives the deposition conditions for various coating types at a fiber travel speed of approximately 90 to 130 m/h.

TABLE 4

| Coating | TiN | Pyrocarbon | C/SiC/Si | SiC |
|---|---|---|---|---|
| t (° C.) | 1150 | 1250 | 900–1200 | 1000 |
| $P_{(total)}$ | 1 | 1 | 1 | 1 |
| $H_2/N_2$ | 4 | — | — | — |
| $H_2/CH_4$ | — | 3 | — | — |
| $H_2/MTS$ | — | — | 2–8 | 4 |
| molar fract educt | 0.02 | 0.05 | 0.06 | 0.06 |
| $V_{(flow)}$ (cm/s) (NB) | 4 | 3 | 4 | 4 |

The fibers, once coated, are cut into variable lengths in the device shown in FIG. 5 and after-coated in a microwave field in the after-coating device as already described for the short fibers. This seals the exposed cut surfaces. The time spent by the cut fibers in the after-coating reactor is shorter than that spent by the short fiber bundles in the device shown in FIG. 1. The coating thicknesses produced by after-coating to seal the cut surfaces then amounts only to approximately 5 to 6 nm. This is sufficient for the sealing effect.

Figure 9A:
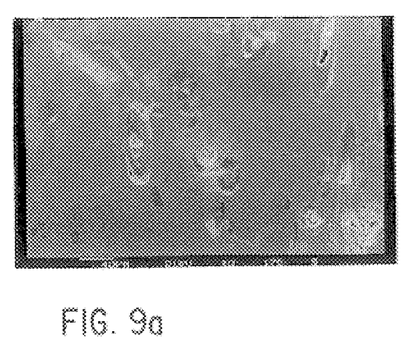
FIGS. 9a and 9b are REM images of short-fiber-reinforced ceramic composites with uncoated short fibers (FIG. 9a) and coated short fibers (FIG. 9b)
Figure 9B:
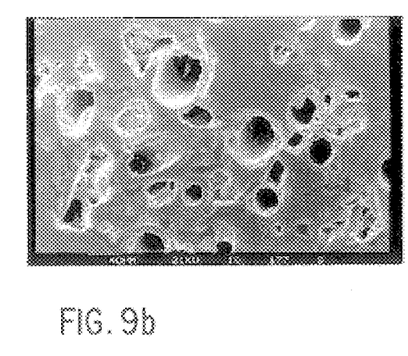
Figure 10:
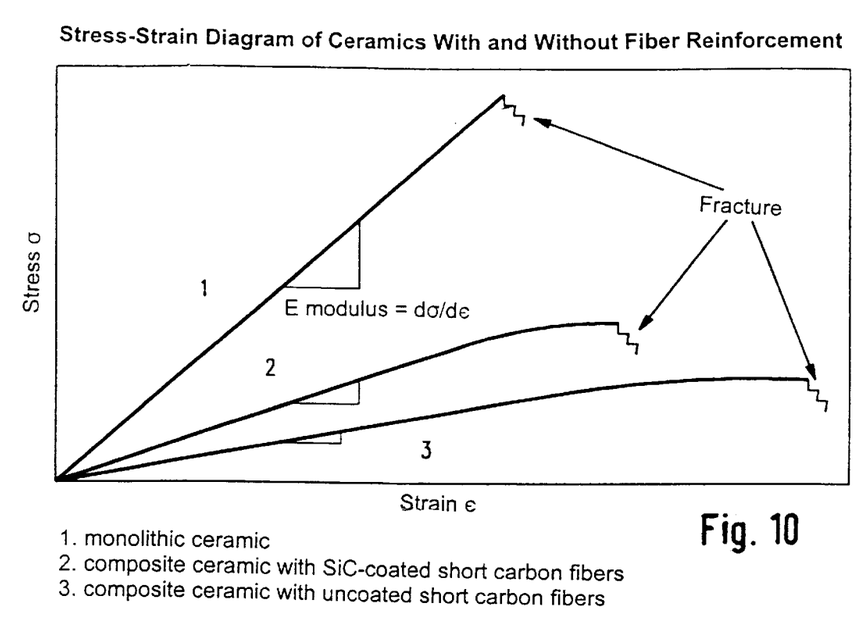
FIG. 10 is a stress-strain diagram of ceramics with and without fiber reinforcement.

The fibers coated in this way provide improved wetability of the fiber surfaces by the matrix in fiber-reinforced composites. As a result, the volume percentage of the fiber components in the composite is higher. FIGS. 9a and 9b show such a ceramic composite with uncoated fibers (FIG. 9a) and with SiC-coated fibers (FIG. 9b). The increased proportion of fibers brought about by coating can be clearly seen. The increased proportion of fibers causes the composite to become more ductile and thus have considerably improved mechanical properties, particular avoidance of brittle fractures. FIG. 10 shows an example of this in the form of a stress-strain diagram of ceramic composites.

Figure 11:
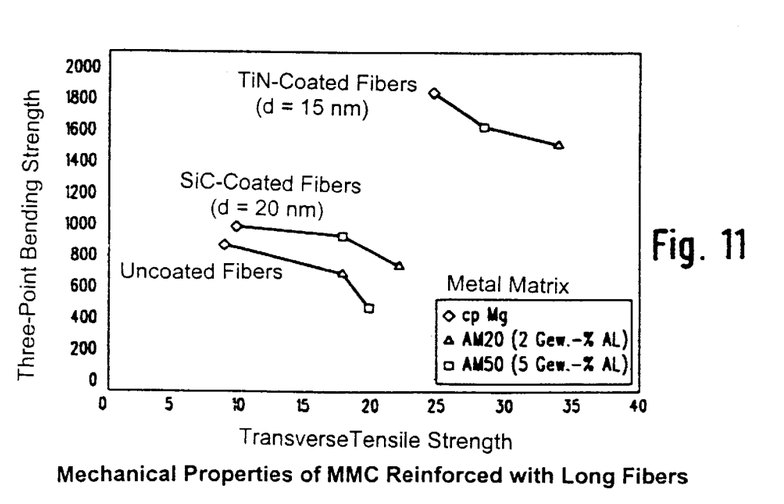
FIG. 11 shows the mechanical properties of long-fiber-reinforced metal matrix composites.

In metal matrix composites, SiC or TiN coating, or example, prevents the fiber surface from reacting with the molten metal (e.g., Mg or Mg/Al alloys) while the composite is being produced. The coating then serves as a diffusion and reaction barrier. This, and the improved wetability of the fibers by the matrix, also improves the mechanical properties of metal matrix composites. FIG. 11 shows the three-point bending strengths and transverse tensile strengths of various metal matrix composites plotted against each other at room temperature. These are metal matrices with one-directional windings made of long carbon fibers with a fiber volume percentage of 50%. The composite reinforced with fibers coated with TiN has strengths equivalent to those of high-performance steel. When metal matrix composites are made by gas pressure melt infiltration, the infiltration pressure can be reduced to approximately one-tenth the usual value (e.g., from 100 bars to less than 10 bars).

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for manufacturing coated short fibers, comprising:

introducing a short fiber bundle having a coating or a fiber-containing plastic matrix into a reactor;

exposing said coated short fiber bundle or said fiber-containing plastic matrix to a microwave field which breaks down the coating or the plastic matrix, thereby separating the fiber bundle or fibers in said fiber-containing plastic matrix into individual fibers; and coating the individual fibers on all sides by chemical vapor deposition with at least one coating agent present in the reactor as a gas, thereby forming a coating on the individual fibers.

2. A method according to claim 1, wherein said short fibers are carbon fibers.

3. A method according to claim 1, wherein said short fibers are recyclate fibers.

4. A method according to claim 1, further comprising mechanically loosening the short fiber bundle before said exposing to the microwave field.

5. A method according to claim 1, wherein said coating on the individual fibers comprises at least one of pyrocarbon, SiC or Si.

6. A method according to claim 5, wherein said coating on the individual fibers comprises at least one of a carbon-graduated or Si-graduated silicon carbide coating.

7. A method according to claim 6, wherein the graduated silicon carbide coating is deposited by varying a composition of the gas or a temperature of said coating by chemical vapor deposition.

8. A method according to claim 6, wherein the at least one coating agent is methyltrichlorosilane/hydrogen.

9. A method according to claim 1, wherein said coating on the individual fibers comprises at least one of pyrocarbon, TiN, TiCN or TiC.

10. A method according to claim 9, wherein said coating on the individual fibers comprises at least one of a carbon-graduated or a N-graduated titanium carbonitride layer.

11. A method according to claim 10, wherein the graduated titanium carbonitride coating is deposited by varying a composition of the gas or a temperature of said coating by chemical valor deposition.

12. A method according to claim 9, wherein the at least one coating agent comprises titanium tetrachloride with nitrogen and optionally methane in hydrogen.

13. A method according to claim 1, wherein a thickness of the coating on the individual fibers is controlled by the time the fibers spend in the reactor.

14. A method according to claim 1, wherein the short fiber bundle comprises fibers having a length of 3 to 30 mm.

15. A method for manufacturing coated fibers, comprising:

introducing a fiber bundle having a coating or a fiber-containing plastic matrix into a reactor;

exposing the coated fiber bundle or the fiber-containing plastic matrix to a microwave field which dissolves the coating or the plastic matrix, thereby separating the fiber bundle or fibers in the fiber-containing plastic matrix into individual fibers; and coating the individual fibers on all sides by chemical vapor deposition with at least one coating agent present in the reactor as a gas, thereby forming a coating on the individual fibers.

* * * * *